March 31, 1959 W. E. TAYLOR 2,880,383

HIGH FREQUENCY TRANSISTOR PACKAGE

Filed Oct. 5, 1956

INVENTOR.
William E. Taylor
BY Mueller & Aichele
Attys.

United States Patent Office 2,880,383

Patented Mar. 31, 1959

2,880,383

HIGH FREQUENCY TRANSISTOR PACKAGE

William E. Taylor, Phoenix, Ariz., assignor to Motorola, Inc., Chicago, Ill., a corporation of Illinois Application October 5, 1956, Serial No. 614,140

9 Claims. (Cl. 317—235)

This invention relates to semiconductor devices, and more particularly to high frequency junction transistors.

High frequency response of junction transistors has been limited in the past by capacitance between the collector electrode on the one hand and the emitter electrode and the base electrode on the other, commonly called the collector capacitance. Collector capacitance of transistor units has been reduced greatly by the advent of diffused base p-n-i-p type transistors. However, capacitance between the collector lead and the emitter and base leads has remained a problem and no simple, economical structures minimizing collector lead capacitance have been known hitherto.

An object of the invention is to provide new and improved transistors.

Another object of the invention is to provide new and improved transistors having high frequency response.

Another object of the invention is to provide transistors having minimum collector lead or header capacitance.

A feature of the invention is the provision of transistors in which the capacitance of the collector lead is so negligible that shielding is unnecessary.

Another feature of the invention is the provision of transistors having leads disposed in such a manner that capacitance therebetween is negligible.

Another feature of the invention is the provision of a transistor unit having leads diverging widely from one another and spaced apart at distances sufficient that there is substantially no capacitance therebetween. The leads may project radially through a shell or cover enclosing the unit, and the shell may serve as the sole support of the leads and the unit.

A complete understanding of the invention may be obtained from the following detailed description of a transistor forming a specific embodiment thereof, when read in conjunction with the appended drawings, in which.

Figure 1:
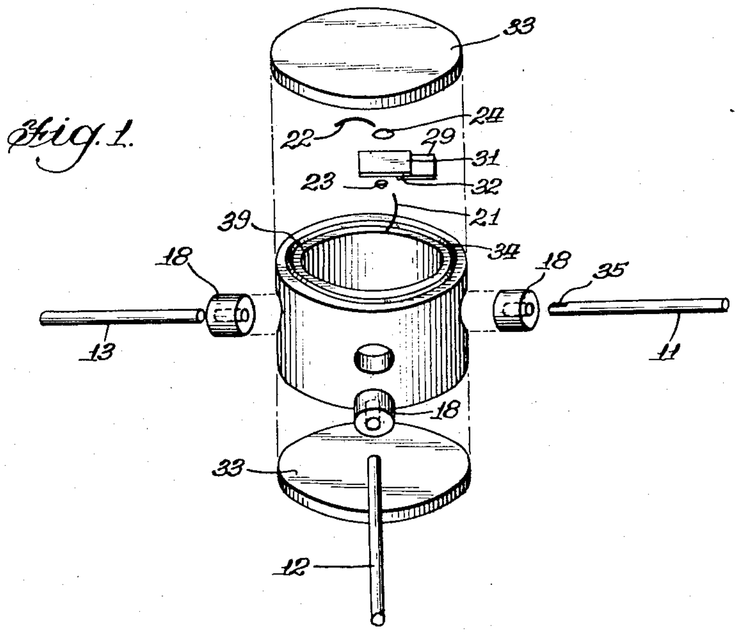
Fig. 1 is an exploded perspective view of a transistor forming one embodiment of the invention.
Figure 2:
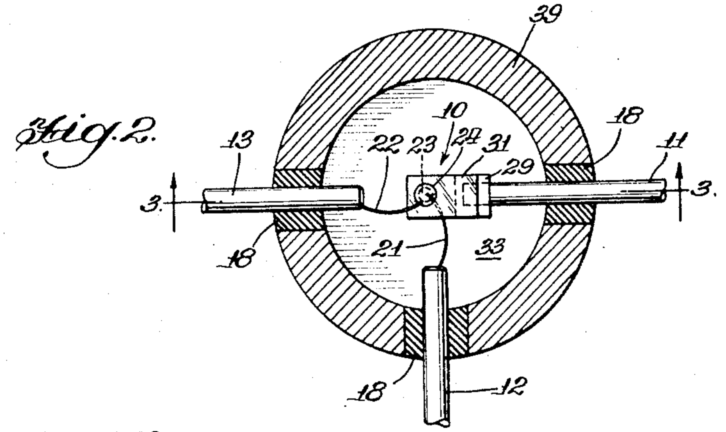
Fig. 2 is a horizontal section of the transistor shown in Fig. 1.
Figure 3:
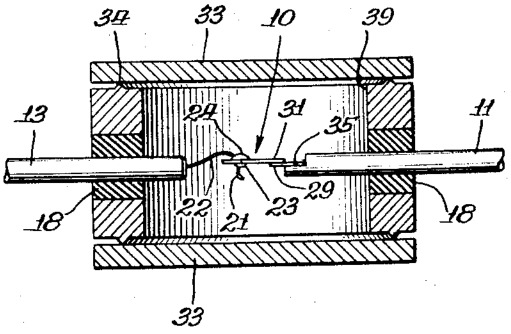
Fig. 3 is a vertical section taken along line 3—3 of Fig. 2.

The invention provides a transistor having a very slight collector lead capacitance. This is accomplished by the provision of base and emitter connectors or leads diverging widely from one another or being disposed as far as possible from parallelism with respect to one another. The connecting leads, which may be quite stiff, are mounted in radially diverging positions extending through a shallow ring-like housing or mounting base, and a high frequency die assembly is mounted on the base connector. Fine lead wires connect the emitter and collector electrodes to the connectors, and a pair of discs are fused to the ends of the housing to complete the transistor.

Referring now in detail to the drawings, there is shown a transistor including a high frequency diffused base transistor die assembly 10 of known structure mounted on a heavy, rigid base connector or connector lead 11.

The base lead 11 and an emitter connector or connector lead 12 diverge widely from a heavy, rigid collector connector or connector lead 13. All of these leads may be of "Kovar," nickel-silver, Monel metal, steel, or the like. The divergence and separation of the connector leads are sufficient that capacitance between these leads is negligible in the operation of the transistor at very high frequencies. Such divergent location of these leads is made possible by extending them through an annular or short cylindrical housing or mounting ring 17 of "Kovar," steel, or the like.

Bushings 18 of glass or other suitable electrical insulating and moisture impervious material are sealed by known methods to the connectors and the ring to form hermetic seals with the leads and the ring and also insulate the connectors from the ring. Fine, flexible lead wires 21 and 22 of nickel, copper, or other conductive metals, preferably not of spring temper, are connected to emitter and collector electrodes 23 and 24, respectively, and also are connected by soldered joints, spot welding, or the like to the inner ends of the connectors 12 and 13. These wires are arched away from one another as much as possible in their paths from the electrodes to the connectors and are of very small diameter, preferably of the order of 0.002 of an inch, so that they are flexible and so that there is substantially no capacitance between the wires. The inner ends of the connectors 11, 12 and 13 are spaced from one another so far that capacitance therebetween is very low, preferably being spaced at least one eighth of an inch from one another when the dielectric therebetween is air. A die 31 of the die assembly 10 has a base layer portion 32 of a known type ohmically connected to a base electrode 29, which is mechanically and electrically connected by solder or fusing to the base connector 11, which rigidly supports the die assembly 10.

Discs or covers 33 are hermetically sealed to the ring by condenser-discharge resistance welding through annular ribs or ridges 34 formed on the ends of the ring. The welding by means of the sharp ribs localizes heat at the weld area and is quite brief. Also, the ribs are spaced outwardly from the inner edges 39 of the ring so that the ring shields the die assembly during the welding operation.

In assembling the transistor, the leads 11, 12, and 13 are sealed by the bushings 18 to the ring 17. Then the die assembly 10 is positioned on a flat 35 on the lead 11 and is fused thereto by brazing or the like. The wires 21 and 22 are fused to the contacts 23 and 24 by known methods. The outer ends of the wires 21 and 22 are fused to the leads 12 and 13, and the covers 33 are sealed to the ring. The outer ends of the leads then may be bent, if desired, to form pins for insertion into sockets or for connection to printed circuit boards. However, such bending would not be done where extremely high frequency responses are desired. In one successful example, the length of the ring was about 0.25 of an inch and the external diameter thereof was about .437 of an inch. The die assembly is very accessible in the shallow or short ring for cleaning, attaching the leads, and operations on the die assembly.

The transistor described hereinabove is shown with the collector lead 13 spaced 180° from the base lead 11 and 90° from the emitter lead 12, the collector and base leads being directly aligned to minimize capacitance therebetween. The radial location of the heavy leads 11, 12, and 13 causes the leads to deviate greatly from parallel positions and be widely divergent so that capacitance therebetween is minimized. Since the capacitance primarily limiting high frequency response is that between the collector and the base, which includes the capacitance between the conductive elements leading thereto, by keeping the collector lead and base lead directly aligned or 180° apart, the capacitance effect of the collector lead and the base lead on one another is extremely small. Also, since the capacitance of the collector lead is the critical factor, the base and emitter leads can be spaced at wide angles relative to the collector lead. For example, the emitter and base leads may be 90° apart and the collector lead may be 135° from each of the other two.

The above-described transistor is extremely small and the capacitance of the collector lead 13 or between the collector lead and the base lead is down to about 0.002 micromicrofarad, which capacitance is very low as compared with the capacitance between the collector contact 24 and the base contact 23, which is usually of the order of 0.1 micromicrofarad. Thus, the small collector lead or header capacitance may be disregarded as a limiting factor on high frequency response of the translator. With prior art transistors, the header capacitance has usually been of the order of 1 to 2 micromicrofarads.

I claim:

1. A transistor which comprises a transistor die assembly having opposed emitter and collector electrodes and a base electrode, a stiff lead connected to the base electrode and extending in one direction, a stiff collector lead extending from the base lead at a divergent angle relative thereto and spaced substantially from the base lead so that capacitance therebetween is minimized, a fine wire connected to the collector electrode and the collector lead, a stiff emitter lead extending in a diverging direction relative to and spaced substantially from the collector lead so that capacitance therebetween is minimized, a fine wire connected to the emitter electrode and the emitter lead, and cylindrical housing means surrounding said die assembly supporting the leads in such positions.

2. A transistor which comprises a cylindrical housing having holes therethrough disposed radially in the housing and at wide angles relative to one another, a plurality of stiff leads extending through the holes in positions in which the inner ends of the leads are spaced substantially from one another, a transistor die assembly including a die and emitter and collector electrodes and positioned centrally within said housing, said die being mounted on one of the leads to form a base connection therewith, lead wires connecting the emitter and collector electrodes to the leads and being arched away from one another.

3. A transistor which comprises a metallic ring having a base lead hole extending radially therethrough and also being provided with a collector lead hole diametrically opposed to the base lead hole; said ring also having an emitter lead hole between the base lead hole and the collector lead hole; a stiff base lead extending through the base lead hole and sealed to the ring, an emitter lead extending through the emitter lead hole and sealed to the ring; a collector lead extending through the collector lead hole and sealed to the ring; a die assembly including a die, an emitter electrode, and a collector electrode; said die being fused to the base lead and supported thereby; a fine spring wire connecting the emitter electrode to the emitter lead; and a second fine spring wire connecting the collector electrode to the end of the collector lead.

4. A transistor which comprises a transistor die assembly having opposed emitter and collector electrodes and a base electrode positioned at one end thereof, a heavy base lead having a flat portion fused to the base electrode and extending in one direction, fine lead wires secured to the emitter and collector electrodes at one end of each wire, a stiff collector lead extending axially of the base lead and spaced substantially from the base lead, said collector lead being connected to the other end of the collector lead wire, a stiff emitter lead connected to the emitter lead wire and extending in such a direction relative to and so spaced from the stiff collector lead that capacitance therebetween is minimized, a heavy cylindrical housing ring having radial holes therethrough through which the stiff leads extend, and sealing means insulating the stiff leads from the housing and hermetically sealing the stiff leads to the housing.

5. A transistor which comprises a cylindrical housing having holes therethrough disposed radially relative to the housing and at wide angles relative to one another, a plurality of stiff leads extending through the several holes in positions in which the inner ends of the leads are spaced substantially from one another, a plurality of insulating bushings serving to seal the leads in the holes in the housing, one of said leads having a flat thereon, a die assembly including a die having a base portion fused to the flat on the last mentioned lead so that the die is supported rigidly by that lead, said die assembly also having opposed collector and emitter electrodes, and fine lead wires connected at one end to the collector and emitter electrodes and also secured to the inner ends of the stiff wire leads.

6. A transistor which comprises a heavy ring having a base lead hole extending radially therethrough and also being provided with a collector lead hole diametrically opposed to the base lead hole, said ring also having an emitter lead hole bisecting the angle between the base lead hole and the collector lead hole, a stiff base lead extending through the base lead hole and sealed to the ring, an emitter lead extending through the emitter lead hole and sealed to the ring, a collector lead extending through the collector lead hole and sealed to the ring, a transistor die assembly including a die and collector and emitter electrodes, said die assembly also having a base portion at one end thereof fused to the base lead to mount the die assembly on the base lead in a position in which the emitter electrode and the collector electrode are located centrally in the ring and spaced substantial distances from the ends of the emitter lead and the collector lead, a fine lead wire connecting the emitter electrode to the emitter lead, a second fine lead wire connecting the collector electrode to the end of the collector lead, said wires being bowed away from one another to avoid capacitance therebetween, and a pair of discs fused to the ends of the ring to hermetically seal the unit in the ring.

7. A transistor including in combination, a semiconductor die assembly having opposed emitter and collector electrodes and a base electrode, a base lead connected to said base electrode and extending in one direction, a collector lead extending in a divergent, angularly spaced direction from said base lead, means establishing electrical connection between said collector lead and said collector electrode, an emitter lead extending in a divergent, angularly spaced direction from said collector lead, means establishing electrical connection between said emitter lead and said emitter electrode and housing means surrounding said die assembly supporting said leads in such positions with said leads passing through said housing means in divergent directions.

8. A transistor including in combination, a housing ring having base lead, collector lead and emitter lead holes extending radially therethrough and angularly spaced from one another, base, emitter and collector leads extending radially through their respective holes and sealed to said ring, a semiconductor die assembly positioned centrally within said ring, said assembly including a die, an emitter electrode and a collector electrode, said die being attached to said base lead and supported thereby, means establishing electrical connection between said emitter electrode and said emitter lead and means establishing electrical connection between said collector electrode and said collector lead.

9. A transistor including in combination, a semiconductor die assembly having opposed emitter and collector electrodes and a base electrode, a housing member surrounding said die, assembly, emitter, collector and base leads extending through and sealed to said housing member, said leads extending away from said die assembly and through said housing member in divergent, angularly spaced directions about 120° apart, said base lead being connected to and supporting said base electrode and means establishing electrical connection between said emitter lead and said emitter electrode and means for establishing electrical connection between said collector lead and said collector electrode.

References Cited in the file of this patent

UNITED STATES PATENTS

| | | |
|---|---|---|
| 2,720,617 | Sardella | Oct. 11, 1955 |
| 2,748,235 | Wallace | May 29, 1956 |
| 2,784,300 | Zuk | Mar. 5, 1957 |

FOREIGN PATENTS

| | | |
|---|---|---|
| 728,288 | Great Britain | Apr. 20, 1955 |